(12) United States Patent
Wada et al.

(10) Patent No.: US 11,894,246 B2
(45) Date of Patent: Feb. 6, 2024

(54) BONDING APPARATUS AND BONDING METHOD

(71) Applicant: Tokyo Electron Limited, Tokyo (JP)

(72) Inventors: Norio Wada, Koshi (JP); Shintaro Sugihara, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/816,810

(22) Filed: Aug. 2, 2022

(65) Prior Publication Data
US 2023/0039173 A1  Feb. 9, 2023

(30) Foreign Application Priority Data

Aug. 5, 2021  (JP) .................................. 2021-129086

(51) Int. Cl.
*B32B 43/00* (2006.01)
*H01L 21/67* (2006.01)
*H01L 21/687* (2006.01)
*H01L 21/683* (2006.01)

(52) U.S. Cl.
CPC .... *H01L 21/67092* (2013.01); *H01L 21/6838* (2013.01); *H01L 21/68742* (2013.01); *B32B 43/006* (2013.01); *Y10T 156/1132* (2015.01); *Y10T 156/1179* (2015.01); *Y10T 156/1944* (2015.01); *Y10T 156/1983* (2015.01)

(58) Field of Classification Search
CPC ............. B32B 43/006; Y10T 156/1179; Y10T 156/1944; Y10T 156/1983; B29C 65/004; B29C 66/00145
See application file for complete search history.

(56) References Cited

U.S. PATENT DOCUMENTS

| 8,715,457 B2* | 5/2014 | Behler | H01L 21/67132 156/707 |
| 2014/0060751 A1* | 3/2014 | Yamamoto | H01L 21/67121 156/707 |
| 2015/0017782 A1* | 1/2015 | Akiyama | H01L 21/67092 438/455 |
| 2021/0287926 A1* | 9/2021 | Eto | H01L 21/6838 |

FOREIGN PATENT DOCUMENTS

JP   2015-095579 A   5/2015

* cited by examiner

*Primary Examiner* — Philip C Tucker
*Assistant Examiner* — Nickolas R Harm
(74) *Attorney, Agent, or Firm* — Pearne & Gordon LLP

(57) ABSTRACT

A bonding apparatus includes a first holder, a second holder, an attracting pressure generator and a lift pin. The first holder is configured to hold a first substrate. The second holder, disposed at a position facing the first holder, has an attraction surface configured to attract a second substrate to be bonded to the first substrate. The attracting pressure generator is configured to generate an attracting pressure in the attraction surface. The lift pin is configured to space the second substrate on the attraction surface apart from the second holder. The second holder is provided with a space including an opening through which the lift pin passes, and the space is controlled to have a pressure lower than an atmospheric pressure.

8 Claims, 15 Drawing Sheets

ID-ING APPARATUS AND BONDING METHOD

CROSS-REFERENCE TO RELATED APPLICATION

This application claims the benefit of Japanese Patent Application No. 2021-129086 filed on Aug. 5, 2021, the entire disclosure of which is incorporated herein by reference.

TECHNICAL FIELD

The various aspects and embodiments described herein pertain generally to a bonding apparatus and a bonding method.

BACKGROUND

Conventionally, as a way to bond substrates such as semiconductor wafers, there is known a method in which surfaces of the substrates to be bonded are modified, the modified surfaces of the substrates are hydrophilized, and the hydrophilized substrates are bonded to each other by a van der Waals force and a hydrogen bond (intermolecular force) (see Patent Document 1).

Patent Document 1: Japanese Patent Laid-open Publication No. 2015-095579

SUMMARY

In one exemplary embodiment, a bonding apparatus includes a first holder, a second holder, an attracting pressure generator and a lift pin. The first holder is configured to hold a first substrate. The second holder, disposed at a position facing the first holder, has an attraction surface configured to attract a second substrate to be bonded to the first substrate. The attracting pressure generator is configured to generate an attracting pressure in the attraction surface. The lift pin is configured to space the second substrate on the attraction surface apart from the second holder. The second holder is provided with a space including an opening through which the lift pin passes, and the space is controlled to have a pressure lower than an atmospheric pressure.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
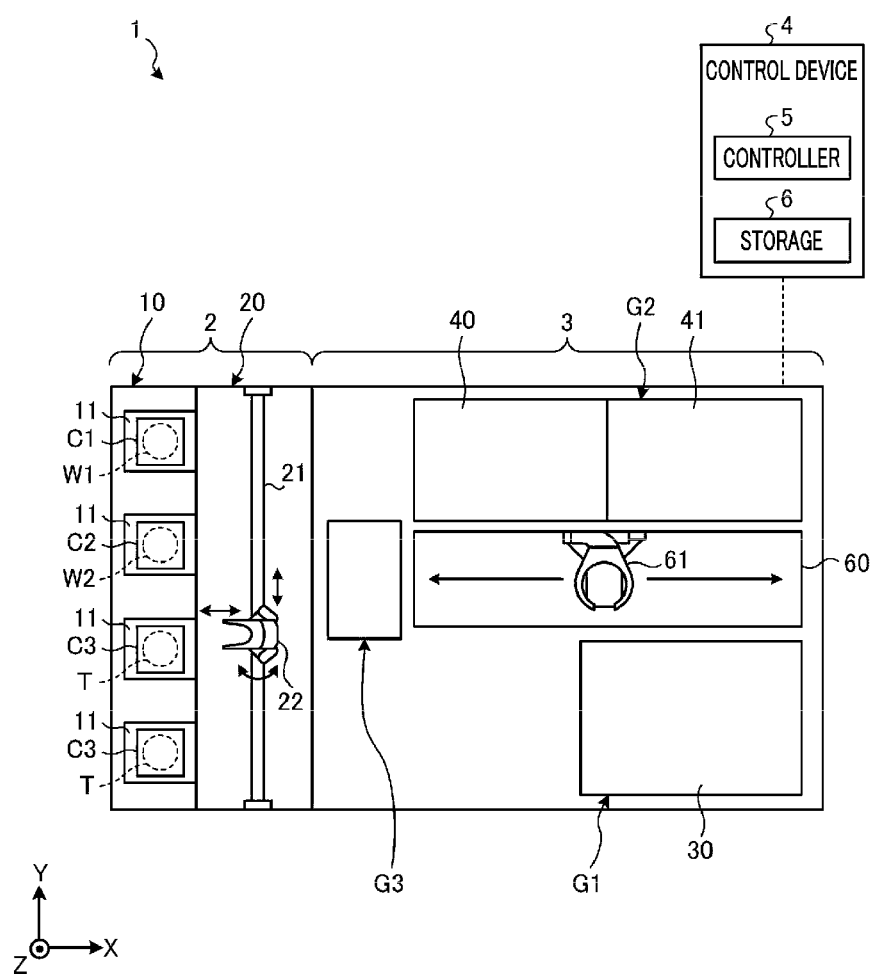
FIG. 1 is a schematic plan view illustrating a configuration of a bonding system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, embodiments for a bonding apparatus and a bonding method according to the present disclosure will be described in detail with reference to the accompanying drawings. The present disclosure is not limited to the exemplary embodiments to be described below. Further, it should be noted that the drawings are schematic and relations in sizes of individual components and ratios of the individual components may sometimes be different from actual values. Even between the drawings, there may exist parts having different dimensional relationships or different ratios.

Conventionally, as a way to bond substrates such as semiconductor wafers, there is known a method in which surfaces of the substrates to be bonded are modified, the modified surfaces of the substrates are hydrophilized, and the hydrophilized substrates are bonded to each other by a van der Waals force and a hydrogen bond (intermolecular force).

Meanwhile, when forming a combined substrate by bonding the hydrophilized substrates to each other, if any one of the substrates is locally deformed, the combined substrate may be distorted due to this deformation. As a result, there is a risk that the yield of elements formed in the combined substrate may be reduced.

In this regard, there is a demand for a technique capable of reducing the distortion of the combined substrate by overcoming the aforementioned problems.

Configuration of Bonding System

Figure 2:
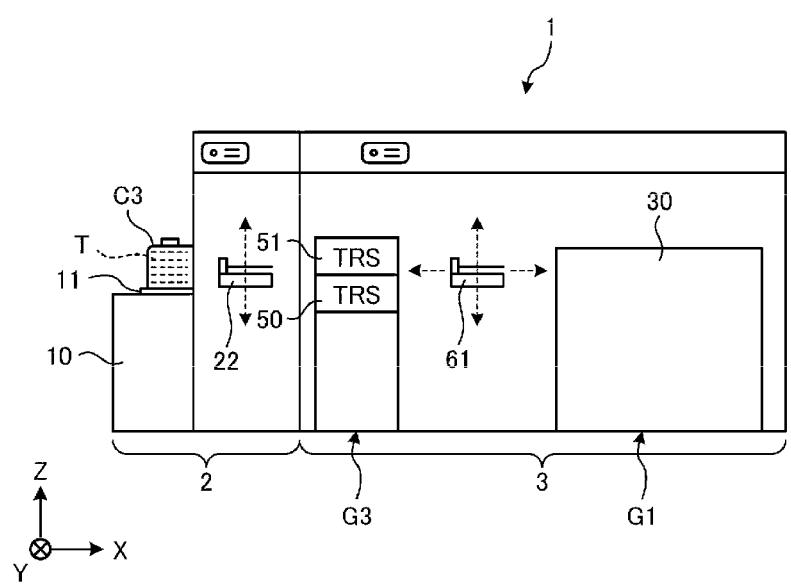
FIG. 2 is a schematic side view illustrating the configuration of the bonding system according to the exemplary embodiment.
Figure 3:
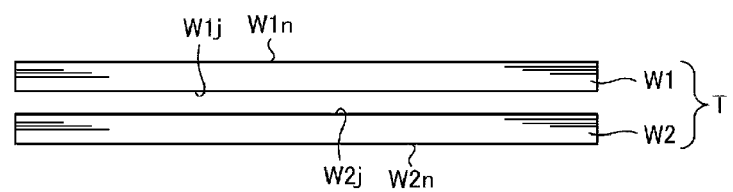
FIG. 3 is a schematic side view illustrating an upper wafer and a lower wafer according to the exemplary embodiment.

First, a configuration of a boding system 1 according to an exemplary embodiment will be described with reference to FIG. 1 to FIG. 3. FIG. 1 and FIG. 2 are a schematic plan view and a schematic side view illustrating the configuration of the bonding system 1 according to the exemplary embodiment, respectively. Further, FIG. 3 is a schematic side view illustrating an upper wafer and a lower wafer according to the exemplary embodiment. In the various accompanying drawings, for the purpose of clear understanding, there may be used a rectangular coordinate system in which the positive Z-axis direction is defined as a vertically upward direction.

The bonding system 1 shown in FIG. 1 forms a combined substrate T by bonding a first substrate W1 and a second substrate W2.

The first substrate W1 is, for example, a semiconductor substrate such as a silicon wafer or a compound semiconductor wafer on which multiple electronic circuits are formed. Further, the second substrate W2 is, for example, a bare wafer on which no electronic circuit is formed. The first substrate W1 and the second substrate W2 have substantially the same diameter. Further, the second substrate W2 may also have an electronic circuit formed thereon.

In the following, the first substrate W1 will be referred to as "upper wafer W1," and the second substrate W2 will be referred to as "lower wafer W2." That is, the upper wafer W1 is an example of the first substrate, and the lower wafer W2 is an example of the second substrate. Further, the upper wafer W1 and the lower wafer W2 may be collectively referred to as "wafer W".

In the following description, as shown in FIG. 3, among surfaces of the upper wafer W1, a surface to be bonded to the lower wafer W2 will be referred to as "bonding surface W1$j$", and a surface opposite to the bonding surface W1$j$ will be referred to as "non-bonding surface W1$n$". Further, among surfaces of the lower wafer W2, a surface to be bonded to the upper wafer W1 will be referred to as "bonding surface W2$j$", and a surface opposite to the bonding surface W2$j$ will be referred to as "non-bonding surface W2$n$."

As shown in FIG. 1, the bonding system 1 includes a carry-in/out station 2 and a processing station 3. The carry-in/out station 2 and the processing station 3 are arranged in this sequence along the positive X-axis direction. Further, the carry-in/out station 2 and the processing station 3 are connected as a single body.

The carry-in/out station 2 includes a placing table 10 and a transfer section 20. The placing table 10 is equipped with a plurality of placing plates 11. Provided on the placing plates 11 are cassettes C1, C2 and C3 each of which accommodates therein a plurality of (for example, 25 sheets of) substrates horizontally. For example, the cassette C1 accommodates therein the upper wafers W1; the cassette C2, the lower wafers W2; and the cassettes C3, the combined substrates T.

The transfer section 20 is provided adjacent to the positive X-axis side of the placing table 10. Provided in the transfer section 20 are a transfer path 21 extended in the Y-axis direction and a transfer device 22 configured to be movable along the transfer path 21.

The transfer device 22 is configured to be movable in the X-axis direction as well as in the Y-axis direction and pivotable around the Z-axis. Further, the transfer device 22 is configured to transfer the upper wafers W1, the lower wafers W2 and the combined substrates T between the cassettes C1 to C3 placed on the placing plates 11 and a third processing block G3 of the processing station 3 to be described later.

Further, the number of the cassettes C1 to C3 placed on the placing plates 11 is not limited to the shown example. In addition to the cassettes C1 to C3, a cassette or the like for collecting a problematic substrate may be further provided on the placing plates 11.

A plurality of, for example, three processing blocks G1, G2 and G3 equipped with various kinds of devices is provided in the processing station 3. For example, the first processing block G1 is provided on the front side (negative Y-axis side of FIG. 1) of the processing station 3, and the second processing block G2 is provided on the rear side (positive Y-axis side of FIG. 1) of the processing station 3. Further, the third processing block G3 is provided on the carry-in/out station 2 side (negative X-axis side of FIG. 1) of the processing station 3.

Provided in the first processing block G1 is a surface modifying apparatus 30 configured to modify the bonding surface W1$j$ of the upper wafer W1 and the bonding surface W2$j$ of the lower wafer W2. The surface modifying apparatus 30 cuts a $SiO_2$ bond on the bonding surface W1$j$ of the upper wafer W1 and the bonding surface W2$j$ of the lower wafer W2 into a single bond of SiO, thus allowing the bonding surfaces W1$j$ and W2$j$ to be modified such that they are easily hydrophilized afterwards.

Further, in the surface modifying apparatus 30, a processing gas is excited into plasma under, for example, a decompressed atmosphere to be ionized. As ions of an atom contained in this processing gas are radiated to the bonding surfaces W1$j$ and W2$j$ of the upper and lower wafers W1 and W2, the bonding surfaces W1$j$ and W2$j$ are modified by being plasma-processed. Details of this surface modifying apparatus 30 will be discussed later.

Further, a surface hydrophilizing apparatus 40 and a bonding apparatus 41 are placed in the second processing block G2. The surface hydrophilizing apparatus 40 is configured to hydrophilize and clean the bonding surfaces W1j and W2j of the upper wafer W1 and the lower wafer W2 with, for example, pure water.

The surface hydrophilizing apparatus 40 supplies the pure water onto the upper wafer W1 or the lower wafer W2 while rotating the upper wafer W1 or the lower wafer W2 held by, for example, a spin chuck. Accordingly, the pure water supplied onto the upper wafer W1 or the lower wafer W2 is diffused on the bonding surface W1j of the upper wafer W1 or the bonding surface W2j of the lower wafer W2. Thus, the bonding surfaces W1j and W2j are hydrophilized.

The bonding apparatus 41 bonds the upper wafer W1 and the lower wafer W2 to each other. The bonding apparatus 41 will be described in detail later.

In the third processing block G3, as shown in FIG. 2, transition (TRS) devices 50 and 51 for the upper wafer W1, the lower wafer W2 and the combined substrate T are provided in two levels in this order from below.

Further, as shown in FIG. 1, a transfer section 60 is formed in a region surrounded by the first processing block G1, the second processing block G2 and the third processing block G3. A transfer device 61 is provided in the transfer section 60. The transfer device 61 is equipped with, for example, a transfer arm which is configured to be movable in a vertical direction and a horizontal direction and pivotable around a vertical axis.

The transfer device 61 is moved within the transfer section 60 and transfers the upper wafers W1, the lower wafers W2 and the combined substrates T with respect to given devices within the first processing block G1, the second processing block G2 and the third processing block G3 which are adjacent to the transfer section 60.

The bonding system 1 further includes a control device 4. The control device 4 controls an operation of the bonding system 1. The control device 4 may be implemented by, for example, a computer and includes a controller 5 and a storage 6. The storage 6 stores a program for controlling various processings such as a bonding processing. The controller 5 controls an operation of the bonding system 1 by reading out the program stored in the storage 6 and executing the program.

Further, the program may be recorded on a computer-readable recording medium and installed from the recording medium to the storage 6 of the control device 4. The computer-readable recording medium may be, for example, a hard disk (HD), a flexible disk (FD), a compact disk (CD), a magnetic optical disk (MO), a memory card, or the like.

Configuration of Surface Modifying Apparatus

Figure 4:
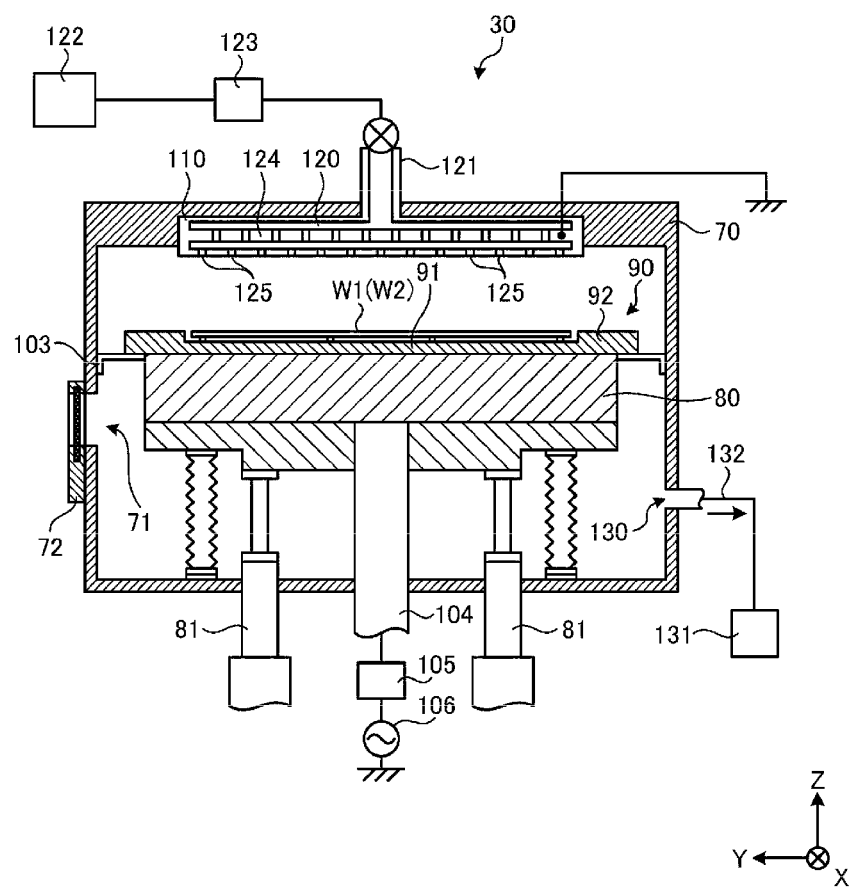
FIG. 4 is a schematic cross sectional view illustrating a configuration of a surface modifying apparatus according to the exemplary embodiment.

Now, a configuration of the surface modifying apparatus 30 will be described with reference to FIG. 4. FIG. 4 is a schematic cross sectional view illustrating the configuration of the surface modifying apparatus 30.

As depicted in FIG. 4, the surface modifying apparatus 30 includes a processing vessel 70 having a hermetically sealable inside. A carry-in/out opening 71 for the upper wafer W1 or the lower wafer W2 is formed in a side surface of the processing vessel 70 on the transfer section 60 (see FIG. 1) side, and a gate valve 72 is provided at the carry-in/out opening 71.

A stage 80 is disposed inside the processing vessel 70. The stage 80 is, for example, a lower electrode, and is made of a conductive material such as, but not limited to, aluminum. A plurality of driving units 81 equipped with, for example, a motor is provided under the stage 80. The driving units 81 are configured to move the stage 80 up and down.

An exhaust ring 103 provided with a multiple number of baffle holes is disposed between the stage 80 and an inner wall of the processing vessel 70. An atmosphere within the processing vessel 70 is uniformly exhausted from the inside of the processing vessel 70 by the exhaust ring 103.

A power feed rod 104 formed of a conductor is connected to a bottom surface of the stage 80. A first high frequency power supply 106 is connected to the power feed rod 104 via a matching device 105 which is composed of, for example, a blocking capacitor or the like. When a plasma processing is performed, a preset high frequency voltage is applied to the stage 80 from the first high frequency power supply 106.

An upper electrode 110 is disposed within the processing vessel 70. A top surface of the stage 80 and a bottom surface of the upper electrode 110 are disposed to face each other in parallel with a certain distance therebetween. The distance between the top surface of the stage 80 and the bottom surface of the upper electrode 110 is adjusted by the driving units 81.

The upper electrode 110 is grounded and connected to the ground potential. Since the upper electrode 110 is grounded in this way, damage to the bottom surface of the upper electrode 110 can be suppressed during the plasma processing.

In this way, as the high frequency voltage is applied from the first high frequency power supply 106 to the stage 80 serving as the lower electrode, plasma is formed within the processing vessel 70.

In the exemplary embodiment, the stage 80, the power feed rod 104, the matching device 105, the first high frequency power supply 106 and the upper electrode 110 constitute an example of a plasma forming mechanism configured to form the plasma of the processing gas within the processing vessel 70. Moreover, the first high frequency power supply 106 is controlled by the controller 5 of the control device 4 mentioned above.

A hollow space 120 is formed within the upper electrode 110. A gas supply line 121 is connected to this hollow space 120. The gas supply line 121 communicates with a gas source 122 that stores therein the processing gas and an electric removal gas. Further, the gas supply line 121 is provided with a supply device group 123 including valves for controlling flows of the processing gas and the electric removal gas, a flow rate adjuster, and so forth.

Then, the processing gas and the electric removal gas supplied from the gas source 122 are introduced into the hollow space 120 of the upper electrode 110 through the gas supply line 121 after their flow rates are adjusted by the supply device group 123. As an example of the processing gas, an oxygen gas, a nitrogen gas, an argon gas, or the like may be used. Further, the electric removal gas may be an inert gas such as, but not limited to, a nitrogen gas or an argon gas.

A baffle plate 124 is provided in the hollow space 120 to accelerate uniform diffusion of the processing gas and the electric removal gas. The baffle plate 124 is provided with a number of small holes. A multiple number of gas discharge openings 125 are formed in the bottom surface of the upper electrode 110 to discharge the processing gas and the electric removal gas from the hollow space 120 into the processing vessel 70.

A suction opening 130 is formed in the processing chamber 70. The suction opening 130 is connected to a suction pipe 132 that communicates with a vacuum pump 131 configured to decompress the atmosphere within the processing chamber 70 to a given vacuum level.

An upper surface of the stage 80, i.e., a surface facing an upper electrode 110, is a circular horizontal surface having a greater diameter than the upper wafer W1 and the lower wafer W2 when viewed from the top. A stage cover 90 is placed on the upper surface of the stage 80, and the upper wafer W1 or the lower wafer W2 is placed on a placing portion 91 of the stage cover 90.

Configuration of Bonding Apparatus

Figure 5:
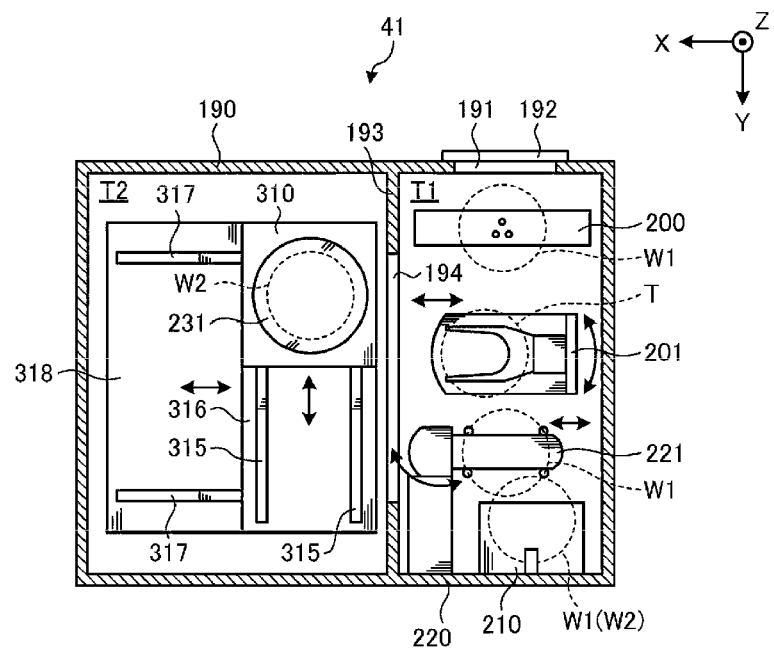
FIG. 5 is a schematic plan view illustrating a configuration of a bonding apparatus according to the exemplary embodiment.
Figure 6:
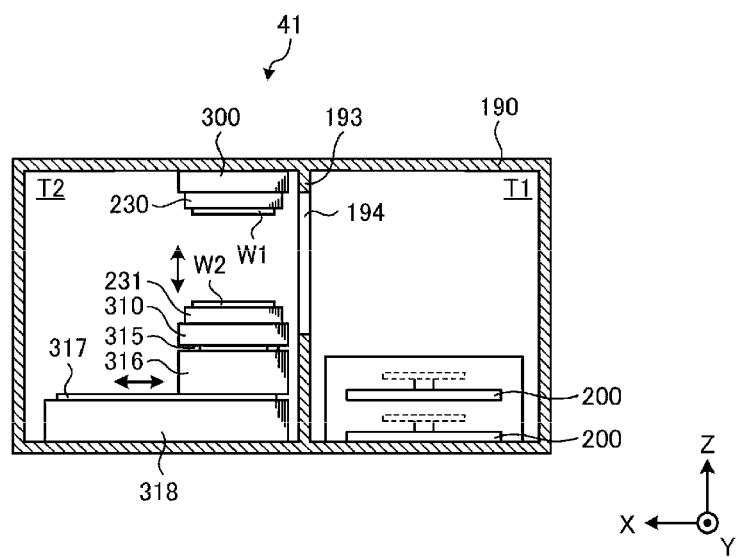
FIG. 6 is a schematic side view illustrating the configuration of the bonding apparatus according to the exemplary embodiment.

Now, a configuration of the bonding apparatus 41 will be discussed with reference to FIG. 5 and FIG. 6. FIG. 5 is a schematic plan view illustrating the configuration of the bonding apparatus 41 according to the exemplary embodiment, and FIG. 6 is a schematic side view illustrating the configuration of the bonding apparatus 41 according to the exemplary embodiment.

As depicted in FIG. 5, the bonding apparatus 41 has a processing vessel 190 having a hermetically sealable inside. A carry-in/out opening 191 for the upper wafer W1, the lower wafer W2, and the combined substrate T is formed in a side surface of the processing vessel 190 on the transfer section 60 side, and an opening/closing shutter 192 is provided at the carry-in/out opening 191.

The inside of the processing vessel 190 is partitioned into a transfer region T1 and a processing region T2 by an inner wall 193. The aforementioned carry-in/out opening 191 is formed in the side surface of the processing vessel 190 in the transfer region T1. Further, the inner wall 193 is also provided with a carry-in/out opening 194 for the upper wafer W1, the lower wafer W2, and the combined substrate T.

In addition, the inside of the processing vessel 190 is maintained at a preset constant humidity by a non-illustrated humidity maintaining device. Therefore, the bonding apparatus 18 is capable of performing a bonding processing for the upper wafer W1 and the lower wafer W2 in a stable environment.

On the negative Y-axis side of the transfer region T1, there is provided a transition device 200 configured to temporarily accommodate therein the upper wafer W1, the lower wafer W2, and the combined substrate T. The transition device 200 is formed in, for example, two levels, and is capable of accommodating therein any two of the upper wafer W1, the lower wafer W2, and the combined substrate T at the same time.

A transfer mechanism 201 is provided in the transfer region T1. The transfer mechanism 201 has, for example, a transfer arm configured to be movable in a vertical direction, a horizontal direction and pivotable around a vertical axis. The transfer mechanism 201 transfers the upper wafer W1, the lower wafer W2, and the combined substrate T within the transfer region T1 or between the transfer region T1 and the processing region T2.

A position adjusting mechanism 210 configured to adjust the directions of the upper wafer W1 and the lower wafer W2 in a horizontal direction is provided on the positive Y-axis side of the transfer region T1. In this position adjusting mechanism 210, while rotating the upper wafer W1 and the lower wafer W2 held by a non-illustrated holder, positions of notches of the upper wafer W1 and the lower wafer W2 are detected by a non-illustrated detector.

With this configuration, the position adjusting mechanism 210 adjusts the directions of the upper wafer W1 and the lower wafer W2 in the horizontal direction by adjusting the positions of the notches thereof. Further, an inverting mechanism 220 configured to invert the front and rear surfaces of the upper wafer W1 is provided in the transfer region T1.

Furthermore, as illustrated in FIG. 6, an upper chuck 230 and a lower chuck 231 are provided in the processing region T2. The upper chuck 230 is configured to attract and hold the upper wafer W1 from above it. The lower chuck 231 is provided below the upper chuck 230, and configured to attract and hold the lower wafer W2 from below it. The upper chuck 230 is an example of a first holder, and the lower chuck 231 is an example of a second holder.

As shown in FIG. 6, the upper chuck 230 is supported by a supporting member 300 provided on a ceiling surface of the processing vessel 190. The supporting member 300 is equipped with a non-illustrated upper imaging device configured to image the bonding surface W2j of the lower wafer W2 held by the lower chuck 231. This upper imaging device is provided adjacent to the upper chuck 230.

Furthermore, as depicted in FIG. 5 and FIG. 6, the lower chuck 231 is supported by a first lower chuck mover 310 provided below the lower chuck 231. The first lower chuck mover 310 moves the lower chuck 231 in a horizontal direction (Y-axis direction) as will be described later. Further, the first lower chuck mover 310 is configured to move the lower chuck 231 in a vertical direction and rotate it around a vertical axis.

As shown in FIG. 5, the first lower chuck mover 310 is equipped with a lower imaging device (not shown) configured to image the bonding surface W1j of the upper wafer W1 held by the upper chuck 230. The lower imaging device is provided adjacent to the lower chuck 231.

Moreover, as shown in FIG. 5 and FIG. 6, the first lower chuck mover 310 is mounted to a pair of rails 315 provided at a bottom side of the first lower chuck mover 310 and extending in the horizontal direction (Y-axis direction). The first lower chuck mover 310 is configured to be movable along these rails 315.

The pair of rails 315 are provided on a second lower chuck mover 316. The second lower chuck mover 316 is fastened to a pair of rails 317 provided at a bottom side of the second lower chuck mover 316 and extending in a horizontal direction (X-axis direction).

The second lower chuck mover 316 is configured to be movable along the rails 317, that is, to move the lower chuck 231 in the horizontal direction (X-axis direction). In addition, the pair of rails 317 are disposed on a placing table 318 provided on a bottom surface of the processing vessel 190.

Figure 7:
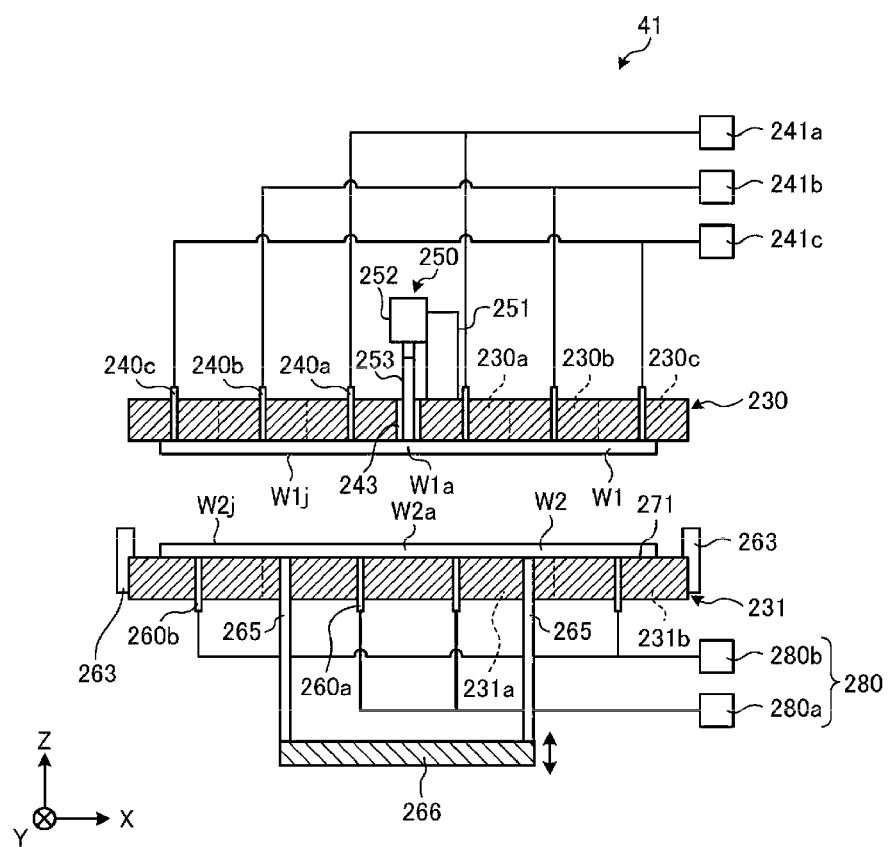
FIG. 7 is a schematic side view illustrating a configuration of an upper chuck and a lower chuck of the bonding apparatus according to the exemplary embodiment.

Now, a configuration of the upper chuck 230 and the lower chuck 231 in the bonding apparatus 41 will be described with reference to FIG. 7. FIG. 7 is a schematic side view illustrating the configuration of the upper chuck 230 and the lower chuck 231 of the bonding apparatus 41 according to the exemplary embodiment.

The upper chuck 230 has a substantially disk shape and is divided into a plurality of, for example, three regions 230a, 230b and 230c, as shown in FIG. 7. These regions 230a, 230b and 230c are arranged in this order from a center of the upper chuck 230 toward a periphery (edge) thereof. The region 230a has a circular shape when viewed from the top, and each of the regions 230b and 230c has an annular shape when viewed from the top.

Suction ports 240a, 240b and 240c for attracting and holding the upper wafer W1 are independently provided in the regions 230a, 230, and 230c, respectively, as shown in FIG. 7. The suction ports 240a, 240b and 240c are connected to separate attracting pressure generators 241a, 241b and 241, respectively. In this way, the upper chuck 230 is configured to be capable of generating an attracting pressure for the upper wafer W1 in each of the regions 230a, 230b and 230c individually.

A through hole 243 is formed through a central portion of the upper chuck 230 in a thickness direction thereof. The central portion of the upper chuck 230 corresponds to a central portion W1a of the upper wafer W1 attracted to and held by the upper chuck 230. A pressing pin 253 of a substrate pressing mechanism 250 is inserted through the through hole 243.

The substrate pressing mechanism 250 is provided on the top surface of the upper chuck 230, and serves to press the central portion W1a of the upper wafer W1 with the pressing pin 253. The pressing pin 253 is configured to be linearly movable along a vertical axis by a cylinder 251 and an actuator 252, and serves to press, with a leading end portion thereof, a substrate (the upper wafer W1 in the present exemplary embodiment) facing the leading end portion thereof.

Specifically, when bonding the upper wafer W1 and the lower wafer W2 as will be described later, the pressing pin 253 serves as a starter that first brings the center portion W1a of the upper wafer W1 and a center portion W2a of the lower wafer W2 into contact with each other.

The lower chuck 231 has a substantially disk shape and is divided into a plurality, for example, two regions 231a and 231b. The regions 231a and 231b are arranged in this order from a center of the lower chuck 231 toward a periphery thereof. Further, when viewed from the top, the region 231a has a circular shape, whereas the region 231b has an annular shape.

As shown in FIG. 7, suction ports 260a and 260b for attracting and holding the lower wafer W2 are independently provided in the regions 231a and 231b, respectively. The suction ports 260a and 260b are connected to separate attracting pressure generators 280a and 280b, respectively.

In this way, the lower chuck 231 is configured to be capable of generating an attracting pressure for the lower wafer W2 in each of the regions 231a and 231b individually. In addition, in the following description, the attracting pressure generators 280a and 280b that generate the attracting pressure for the lower wafer W2 will be collectively referred to as "attracting pressure generator 280".

Further, the lower chuck 231 is equipped with a plurality of lift pins 265 configured to be moved up and down in a vertical direction; and a driving unit 266 configured to move the plurality of lift pins 265. In the lower chuck 231, the lift pins 265 are protruded from an attraction surface 271 to receive and place the lower wafer W2 thereon, and the lift pins 265 are then lowered to bring the lower wafer W2 into contact with the attraction surface 271.

Then, in the lower chuck 231, the attracting pressure generators 280a and 280b are operated, so that the lower wafer W2 is held in each of the regions 231a and 231b, as illustrated in FIG. 7.

Stopper members 263 are provided at multiple positions, for example, five positions on the periphery of the lower chuck 231 to suppress the upper wafer W1, the lower wafer W2 and the combined substrate T from sticking out of the lower chuck 231 or sliding and falling off the lower chuck 231.

Processings Performed by Bonding System

Now, referring to FIG. 8, details of processings performed by the bonding system 1 according to the exemplary embodiment will be explained. The various processings described below are performed under the control of the controller 5 of the control device 4.

Figure 8:
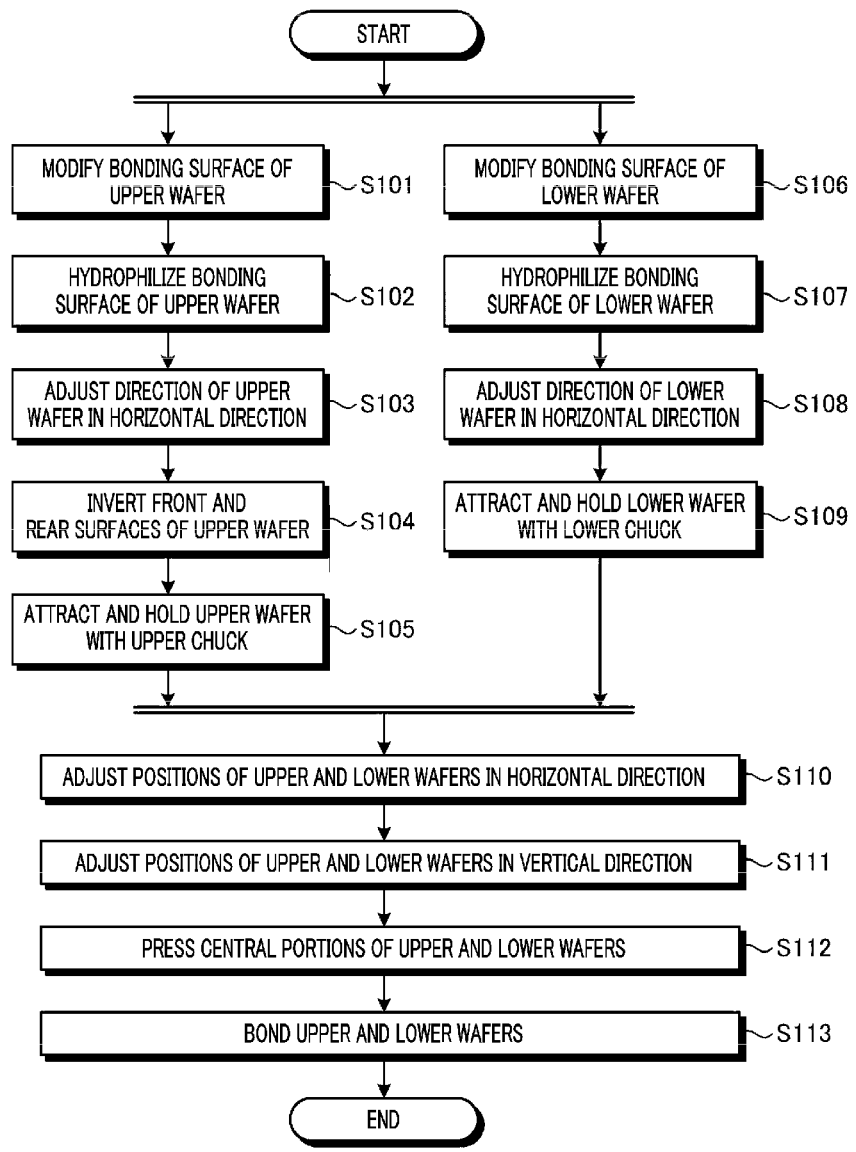
FIG. 8 is a flowchart illustrating a part of a processing sequence of processings performed by the bonding system according to the exemplary embodiment.

FIG. 8 is a flowchart illustrating a part of a processing sequence of the processings performed by the bonding system 1 according to the exemplary embodiment. First, the cassette C1 accommodating therein a plurality of upper wafers W, the cassette C2 accommodating therein a plurality of lower wafers W2, and the empty cassette C3 are placed on the placing plates 11 of the carry-in/out station 2.

Then, the upper wafer W1 within the cassette C1 is taken out by the transfer device 22, and transferred into the transition device 50 of the third processing block G3 of the processing station 3.

Next, the upper wafer W1 is transferred to the surface modifying apparatus 30 of the first processing block G1 by the transfer device 61. At this time, the gate valve 72 is opened, and the inside of the processing vessel 70 is opened to an atmospheric pressure. In the surface modifying apparatus 30, the processing gas is excited into plasma under a decompressed atmosphere to be ionized.

Ions thus generated are radiated to the bonding surface W1j of the upper wafer W1, so that the bonding surface W1j is plasma-processed. Accordingly, dangling bonds of silicon atoms are formed on the outermost surface of the bonding surface W1j, and the bonding surface W1j of the upper wafer W1 is modified (process S101).

Subsequently, the upper wafer W1 is transferred to the surface hydrophilizing apparatus 40 of the second processing block G2 by the transfer device 61. In the surface hydrophilizing apparatus 40, while rotating the upper wafer W1 held by the spin chuck, pure water is supplied onto the upper wafer W1.

The supplied pure water is diffused on the bonding surface W1j of the upper wafer W1. As a result, in the surface hydrophilizing apparatus 40, OH groups (silanol groups) are attached to the dangling bonds of the silicon atoms on the bonding surface W1j of the modified upper wafer W1, so that the bonding surface W1j is hydrophilized (process S102). Further, the bonding surface W1j of the upper wafer W1 is cleaned by the pure water.

Thereafter, the upper wafer W1 is transferred to the bonding apparatus 41 of the second processing block G2 by the transfer device 61. The upper wafer W1 carried into the bonding apparatus 41 is conveyed to the position adjusting mechanism 210 via the transition device 200, and the direction of the upper wafer W1 in the horizontal direction is adjusted by the position adjusting mechanism 210 (process S103).

Thereafter, the upper wafer W1 is transferred from the position adjusting mechanism 210 to the inverting mechanism 220. Then, in the transfer region T1, by operating the inverting mechanism 220, the front and rear surfaces of the upper wafer W1 are inverted (process S104). That is, the bonding surface W1j of the upper wafer W1 is turned to face down.

Afterwards, the inverting mechanism 220 is rotated to be positioned below the upper chuck 230. Then, the upper wafer W1 is transferred from the inverting mechanism 220 to the upper chuck 230. The non-bonding surface Win of the upper wafer W1 is held by the upper chuck 230 (process S105).

While the above-described processes S101 to S105 are being performed on the upper wafer W1, the lower wafer W2 is also processed. First, the lower wafer W2 within the cassette C2 is taken out by the transfer device 22, and transferred to the transition device 50 of the processing station 3.

Next, the lower wafer W2 is transferred to the surface modifying apparatus 30 by the transfer device 61, and the bonding surface W2j of the lower wafer W2 is modified (process S106). This process S106 is the same processing as the above-described process S101.

Thereafter, the lower wafer W2 is transferred to the surface hydrophilizing apparatus 40 by the transfer device 61, and the bonding surface W2j of the lower wafer W2 is hydrophilized (process S107). This process S107 is the same processing as the above-described process S102.

Then, the lower wafer W2 is transferred to the bonding apparatus 41 by the transfer device 61. The lower wafer W2 carried into the bonding apparatus 41 is conveyed to the position adjusting mechanism 210 via the transition device 200. The direction of the lower wafer W2 in the horizontal direction is adjusted by the position adjusting mechanism 210 (process S108).

Thereafter, the lower wafer W2 is transferred to the lower chuck 231 and attracted to and held by the lower chuck 231 (process S109). The non-bonding surface W2n of the lower wafer W2 is attracted to and held by the lower chuck 231 with the notch thereof oriented toward a predetermined direction.

Next, position adjustment of the upper wafer W1 held by the upper chuck 230 and the lower wafer W2 held by the lower chuck 231 in the horizontal direction is carried out (process S110).

Subsequently, the lower chuck 231 is moved vertically upwards by the first lower chuck mover 310, and position adjustment between the upper chuck 230 and the lower chuck 231 in the vertical direction is performed. Accordingly, the position adjustment of the upper wafer W1 held by the upper chuck 230 and the lower wafer W2 held by the lower chuck 231 in the vertical direction is carried out (process S111).

At this time, the distance between the bonding surface W2j of the lower wafer W2 and the bonding surface W1j of the upper wafer W1 is set to be of a predetermined value, for example, 80 μm to 100 μm.

Next, by lowering the pressing pin 253 of the substrate pressing mechanism 250, the central portion W1a of the upper wafer W1 is pressed, allowing the central portion W1a of the upper wafer W1 and the central portion W2a of the lower wafer W2 to be pressed with a preset force (process S112).

Accordingly, bonding is started between the pressed central portions W1a and W2a of the upper and lower wafers W1 and W2. Specifically, since the bonding surface W1j of the upper wafer W1 and the bonding surface W2j of the lower wafer W2 are modified in the processes S101 and S106, respectively, the van der Waals force (intermolecular force) is first generated between the bonding surfaces W1j and W2j, so that the bonding surfaces W1j and W2j are bonded.

Further, since the bonding surface W1j of the upper wafer W1 and the bonding surface W2j of the lower wafer W2 are hydrophilized in the processes S102 and S107, respectively, the OH groups between the bonding surfaces W1j and W2j are hydrogen-bonded, so that the bonding surfaces W1j and W2j are firmly bonded to each other.

Thereafter, a bonding region between the upper wafer W1 and the lower wafer W2 gets expanded from the central portions of the upper and lower wafers W1 and W2 to the peripheries thereof. Thereafter, while pressing the central portion W1a of the upper wafer W1 and the central portion W2a of the lower wafer W2 with the pressing pin 253, the operation of the attracting pressure generator 241b is stopped, so that evacuation for the upper wafer W1 from the suction port 240b in the region 230b is stopped.

As a result, the upper wafer W1 held in the region 230b falls onto the lower wafer W2. Then, the operation of the attracting pressure generator 241c is stopped to stop the evacuation for the upper wafer W1 from the suction port 240c in the region 230c.

In this way, the evacuation for the upper wafer W1 is stopped in stages from the central portion W1a of the upper wafer W1 toward the periphery thereof, thus allowing the upper wafer W1 to be gradually dropped onto the lower wafer W2 to be in contact with it. Then, the bonding by the van der Waals force and the hydrogen bond between the above-described bonding surfaces W1j and W2j spreads from the central portions W1a and W2a toward the peripheries gradually.

In this way, the entire bonding surface W1j of the upper wafer W1 and the entire bonding surface W2j of the lower wafer W2 come into contact with each other, and the upper wafer W1 and the lower wafer W2 are bonded (process S113).

Thereafter, the pressing pin 253 is raised up to the upper chuck 230. Further, in the lower chuck 231, the evacuation for the lower wafer W2 through the suction ports 260a and 260b is stopped to release the attraction and holding of the lower wafer W2 by the lower chuck 231. Accordingly, the bonding processing in the bonding apparatus 41 is ended.

Configuration of Lower Chuck

Figure 9:
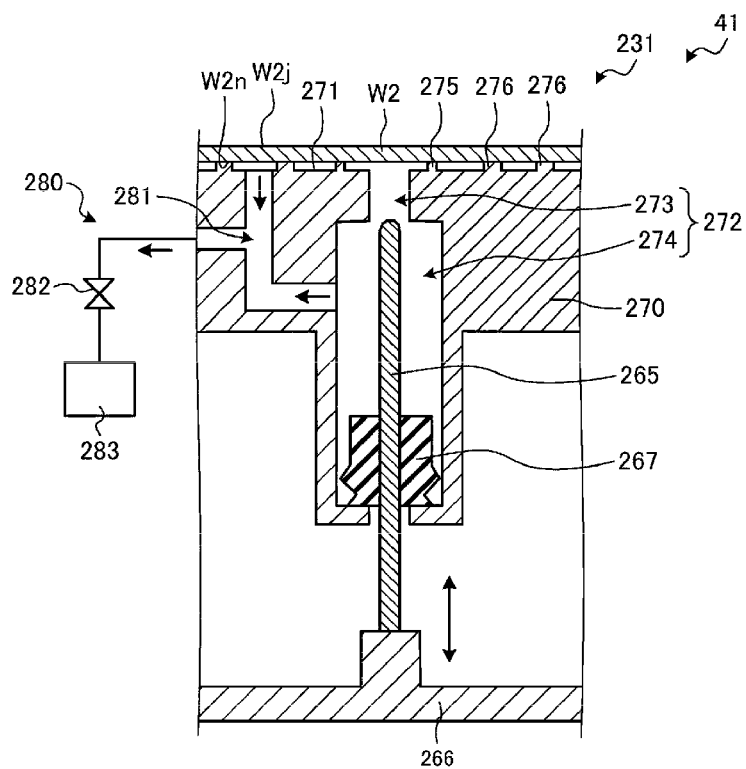
FIG. 9 is an enlarged cross sectional view illustrating a configuration of the lower chuck according to the exemplary embodiment.
Figure 10:
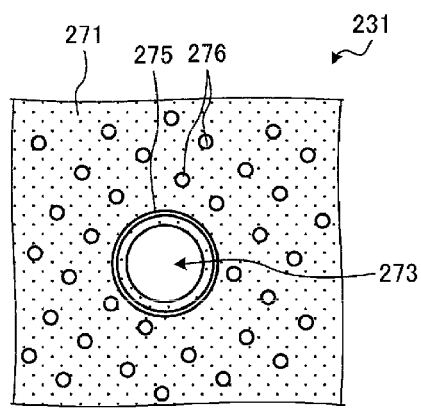
FIG. 10 is an enlarged top view illustrating a configuration of an attraction surface of the lower chuck according to the exemplary embodiment.

Now, a detailed configuration of the lower chuck 231 according to the exemplary embodiment will be discussed with reference to FIG. 9 to FIG. 12B. FIG. 9 is an enlarged cross sectional view illustrating the configuration of the lower chuck 231 according to the exemplary embodiment, and FIG. 10 is an enlarged top view illustrating a configuration of the attraction surface 271 of the lower chuck 231 according to the exemplary embodiment.

As depicted in FIG. 9, the lower chuck 231 has the lift pin 265 and the driving unit 266, and is configured to be capable of transferring the lower wafer W2 by moving the lift pins 265 with the driving unit 266. In addition, a lip seal 267 is provided at a certain position on the lift pin 265. This lip seal 267 is an example of a sealing member.

Further, the lower chuck 231 has a housing 270 having the attraction surface 271, and the lower wafer W2 is held at a top side thereof. Formed inside this housing 270 is a space 272 where an upper portion of the lift pin 265 and the lip seal 267 are accommodated and where the lift pin 265 can be moved up and down.

The space 272 has an opening 273 and an enlarged diameter portion 274. The opening 273 is a portion through which the lift pin 265 passes when it is raised and which is exposed to the attraction surface 271.

The enlarged diameter portion 274 is a portion which has an inner diameter larger than that of the opening 273 and in which the upper portion of the lift pin 265 when the lift pin 265 is being lowered and the lip seal 267 are accommodated. Further, as shown in FIG. 9, when the lift pin 265 is located at a lower position, a gap between the housing 270 and the lift pin 265 is closed by the lip seal 267.

Furthermore, the attraction surface 271 of the housing 270 has a rib 275 and a plurality of supporting pins 276. As illustrated in FIG. 10, the rib 275 is formed in a substantially annular shape along the edge of the opening 273. The plurality of supporting pins 276 are arranged on the entire attraction surface 271 at a substantially equal distance therebetween.

Moreover, as depicted in FIG. 9, a leading end portion of the rib 275 and leading end portions of supporting pins 276 are on a level with each other. Therefore, the lower wafer W2 can be supported substantially horizontally, and the attracting pressure from the attracting pressure generator 280 can be spread to the entire non-bonded surface W2n of the lower wafer W2 in a substantially uniform manner.

Further, in the exemplary embodiment, as the annular rib 275 is formed around the opening 273, regions inside and outside the rib 275 are partitioned from each other when the lower wafer W2 is disposed on the attraction surface 271.

In addition, the lower chuck 231 has the attracting pressure generator 280 configured to generate the attracting pressure in the attraction surface 271. The attracting pressure generator 280 has a flow path 281, a valve 282, and a suction mechanism 283. The flow path 281 is connected between the attraction surface 271 of the housing 270 and the suction mechanism 283.

The suction mechanism 283 is, for example, a pump, and sucks the lower wafer W2 disposed on the attraction surface 271 through the valve 282. The controller 5 is capable of generating the attracting pressure for the lower wafer W2 by operating the valve 282 and the suction mechanism 283.

Here, in the exemplary embodiment, the attracting pressure generator 280 suctions the space 272 formed in the housing 270 as well as the attraction surface 271. For example, in the exemplary embodiment, the flow path 281 is branched to be connected to the enlarged diameter portion 274 of the space 272 as well, so that the space 272 formed in the housing 270 is also suctioned.

Within the space 272, since the gap between the lift pin 265 and the housing 270 is closed by the lip seal 267, the space 272 is controlled to have a pressure lower than the atmospheric pressure in the present exemplary embodiment. By way of example, in the exemplary embodiment, the internal pressure of the space 272 is substantially equal to the attracting pressure of the attraction surface 271.

Figure 11A:
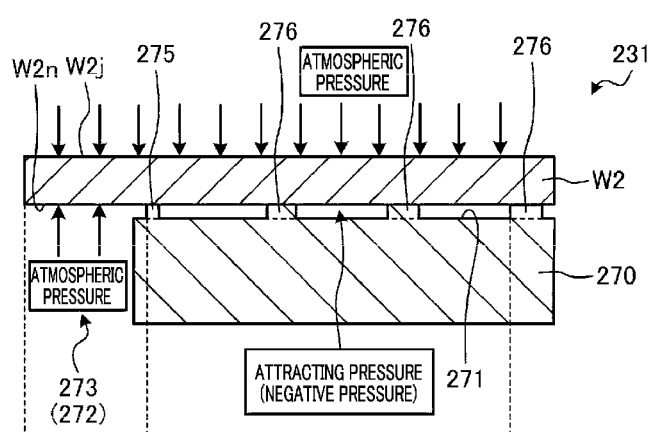
FIG. 11A and FIG. 11B are diagrams showing a simulation model and a simulation result of a displacement of the lower wafer attracted to a lower chuck in a reference example.
Figure 11B:
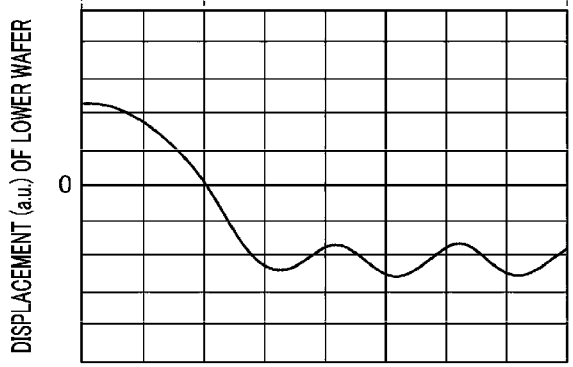

An effect achieved by controlling the internal pressure of the space 272 to be lower than the atmospheric pressure will be described below. FIG. 11A and FIG. 11B are diagrams showing a simulation model and a simulation result of a displacement of the lower wafer W2 attracted to the lower chuck 231 in a reference example.

As shown in FIG. 11A, in this reference example, when the lower wafer W2 is attracted to the lower chuck 231, the opening 273 (that is, the space 272) is under the atmospheric pressure. In this case, the entire bonding surface W2j of the lower wafer W2 is pressed by the atmospheric pressure, whereas only a portion of the non-bonding surface W2n in contact with the opening 273 is pressed by the atmospheric pressure.

That is, in this reference example, since only the portion of the non-bonding surface W2n in contact with the opening 273 is locally pressed, this portion in contact with the opening 273 is largely deformed toward the bonding surface W2j side (upper side), as illustrated in FIG. 11B.

For this reason, in the reference example, due to this large deformation of the lower wafer W2, large distortion occurs in the combined substrate T in which the upper wafer W1 and the lower wafer W2 are bonded to each other.

Figure 12A:
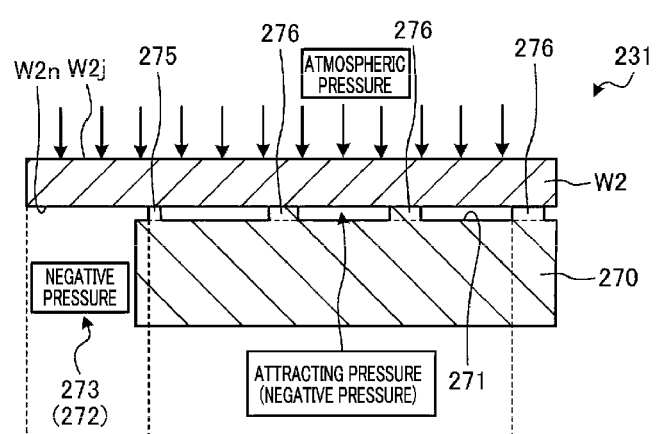
FIG. 12A and FIG. 12B are diagrams illustrating a simulation model and a simulation result of a displacement of the lower wafer attracted to the lower chuck according to the exemplary embodiment.
Figure 12B:
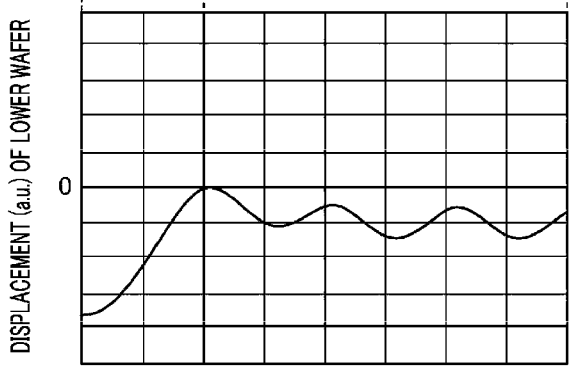

FIG. 12A and FIG. 12B are diagrams showing a simulation model and a simulation result of a displacement of the lower wafer W2 attracted to the lower chuck 231 according to the exemplary embodiment.

As depicted in FIG. 12A, in the present exemplary embodiment, when the lower wafer W2 is attracted to the lower chuck 231, the opening 273 (that is, the space 272) is under a pressure (negative pressure) lower than the atmospheric pressure. In this case, the entire bonding surface W2j of the lower wafer W2 is pressed by the atmospheric pressure, and the entire non-bonding surface W2n is in contact with the space of the negative pressure.

That is, in the exemplary embodiment, the pressure is controlled to be balanced in the entire non-bonding surface W2n. Accordingly, as shown in FIG. 12B, the deformation of the lower wafer W2 can be reduced, as compared to the reference example. Thus, according to the exemplary embodiment, the distortion of the combined substrate T can be reduced.

Furthermore, in the exemplary embodiment, the space 272 may be suctioned by the attracting force generator 280. Thus, an additional suction unit configured to suction the space 272 need not be provided, so that a manufacturing cost of the bonding apparatus 41 can be reduced.

In addition, in the exemplary embodiment, when the upper wafer W1 and the lower wafer W2 are bonded, the lip seal 267 configured to close the gap between the housing 270 and the lift pin 265 may be provided. Thus, since the space 272 can be stably controlled to be under the negative pressure, the distortion of the combined substrate T can be stably reduced.

First Modification Example

Now, various modification examples of the exemplary embodiment will be explained with reference to FIG. 13 to FIG. 19. Further, in the following various modification examples, parts identical to those of the exemplary embodiment will be assigned same reference numerals, and redundant description thereof will be omitted.

Figure 13:
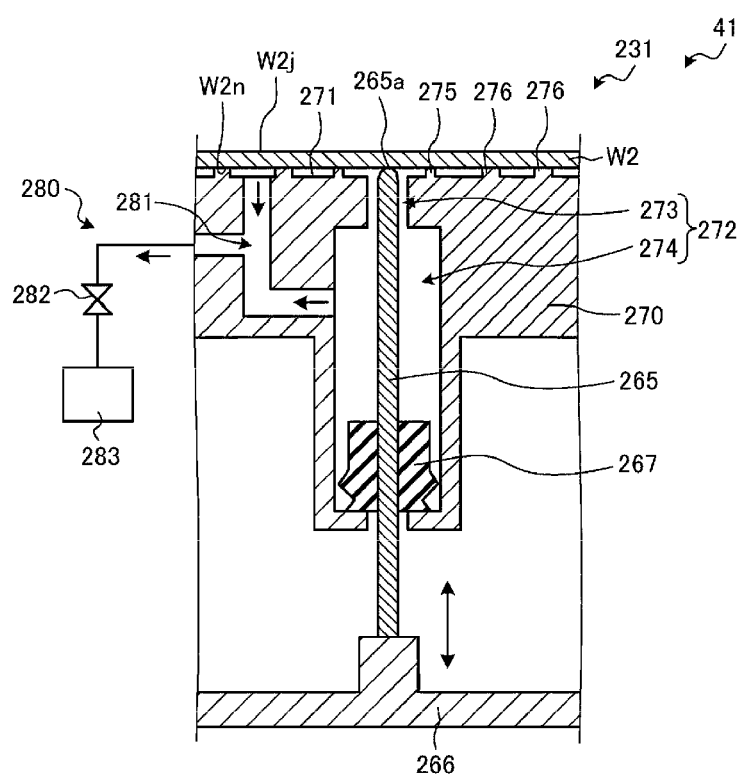
FIG. 13 is an enlarged cross sectional view illustrating a configuration of a lower chuck according to a first modification example of the exemplary embodiment.

FIG. 13 is an enlarged cross sectional view illustrating a configuration of the lower chuck 231 according to a first modification example. As depicted in FIG. 13, when the upper wafer W1 and the lower wafer W2 are bonded, a position of a leading end portion 265a of the lift pin 265 is different from that of the exemplary embodiment.

Specifically, in the first modification example, the leading end portion 265a of the lift pin 265 is substantially on a level with the leading end portions of the plurality of supporting pins 276 when the upper wafer W1 and the lower wafer W2 are bonded. That is, in the first modification example, the leading end portion 265a of the lift pin 265 is also substantially on a level with the leading end portion of the rib 275 when the upper wafer W1 and the lower wafer W2 are bonded.

Figure 14A:
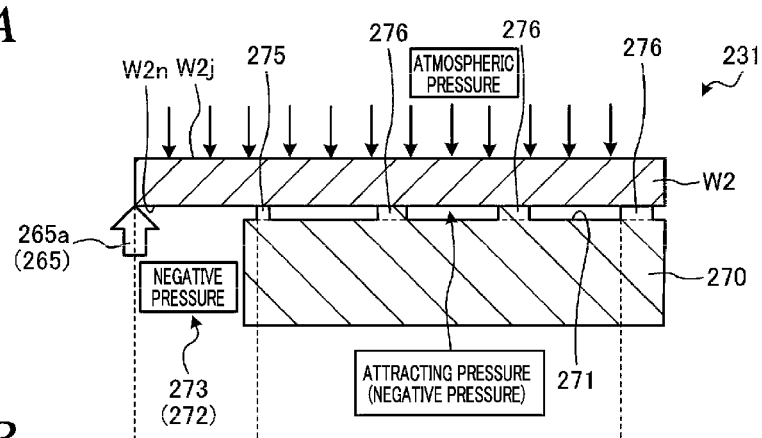
FIG. 14A and FIG. 14B are diagrams illustrating a simulation model and a simulation result of a displacement of the lower wafer attracted to the lower chuck according to the first modification example of the exemplary embodiment.
Figure 14B:
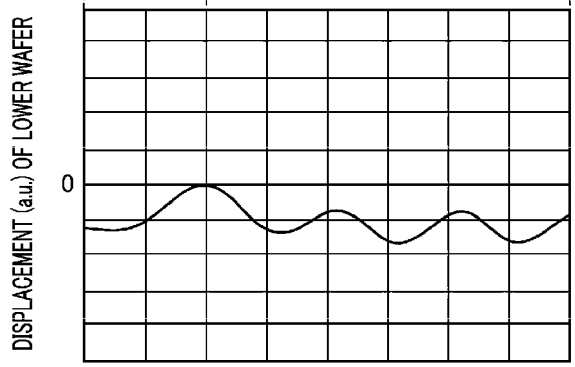

With this configuration, when the upper wafer W1 and the lower wafer W2 are bonded, the lower wafer W2 can be supported even in the region inside the rib 275. The effect of this configuration will be explained below. FIG. 14A and FIG. 14B are diagrams illustrating a simulation model and a simulation result of a displacement of the lower wafer W2 attracted to the lower chuck 231 according to the first modification example of the exemplary embodiment.

As shown in FIG. 14A, in the first modification example, when the lower wafer W2 is attracted to the lower chuck 231, the opening 273 (that is, the space 272) is under the negative pressure, and the lower wafer W2 is supported by the leading end portion 265a of the lift pin 265 in a central portion of the opening 273.

In this case, the lower wafer W2 can be supported on the leading end portion 265a of the lift pin 265 inside the opening 273 whose diameter is larger than the distance between the adjacent supporting pins 276. With this configuration, the deformation of the lower wafer W2 can be further reduced, as shown in FIG. 14B. Thus, according to the first modification example, the distortion of the combined substrate T can be further reduced.

Second Modification Example

Figure 15:
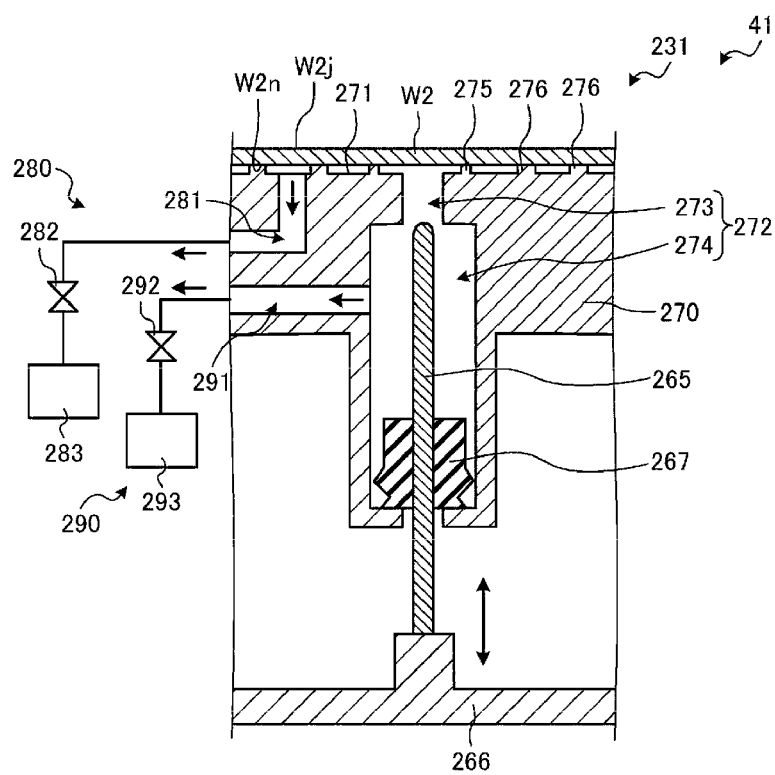
FIG. 15 is an enlarged cross sectional view illustrating a configuration of a lower chuck according to a second modification example of the exemplary embodiment.

FIG. 15 is an enlarged cross sectional view illustrating a configuration of the lower chuck 231 according to a second modification example. As depicted in FIG. 15, the second modification example is different from the exemplary embodiment in that a suction unit 290 configured to suction the space 272 is additionally provided.

The suction unit 290 has a flow path 291, a valve 292, and a suction mechanism 293. The flow path 291 is connected between the space 272 of the housing 270 and the suction mechanism 293. The suction mechanism 293 is, for example, a pump, and suctions the space 272 through the valve 292.

The controller 5 may control the space 272 to be under a pressure lower than the atmospheric pressure by operating the valve 292 and the suction mechanism 293. Thus, since the space 272 can be stably controlled to be under the negative pressure, distortion of the combined substrate T can be stably reduced.

In addition, in the second modification example, the suction unit 290 may suction the space 272 so that the space 272 has a pressure higher than the attracting pressure of the attraction surface 271. Accordingly, it is possible to suppress the deformation of the lower wafer W2 toward the non-bonding surface W2n side inside the opening 273 having the diameter larger than the distance between the adjacent supporting pins 276.

Therefore, according to the second modification example, the distortion of the combined substrate T can be further reduced.

Third Modification Example

Figure 16:
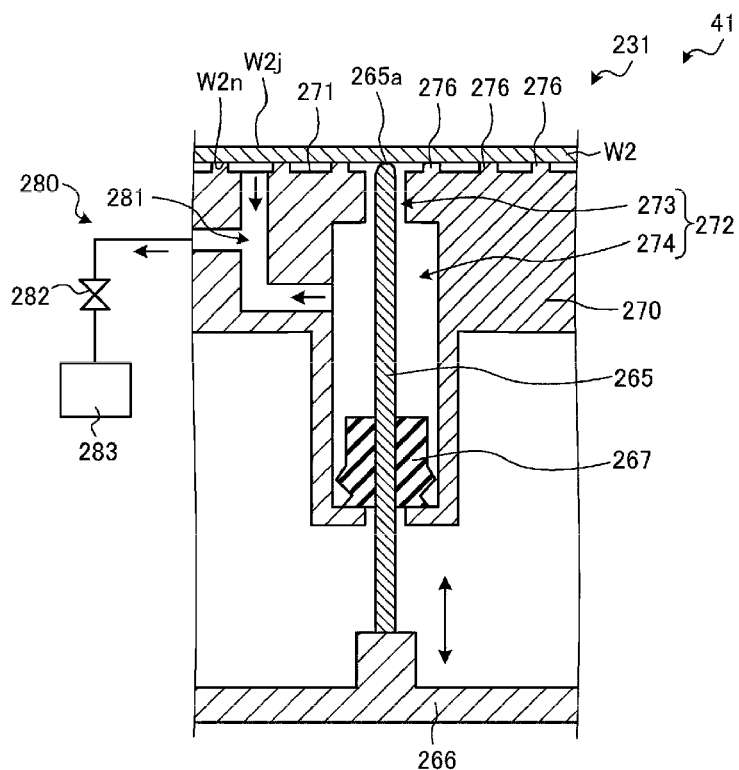
FIG. 16 is an enlarged cross sectional view illustrating a configuration of a lower chuck according to a third modification example of the exemplary embodiment.
Figure 17:
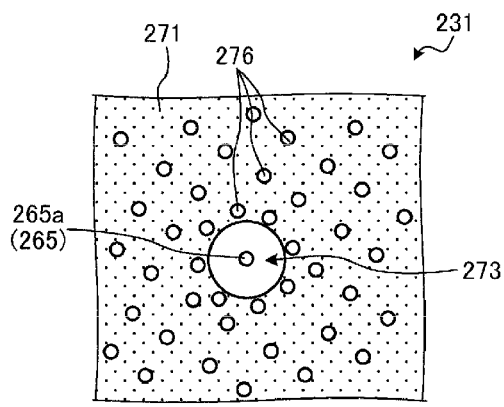
FIG. 17 is an enlarged top view illustrating a configuration of an attraction surface of the lower chuck according to the third modification example of the exemplary embodiment.

FIG. 16 is an enlarged cross sectional view showing a configuration of the lower chuck 231 according to a third modification example of the exemplary embodiment, and FIG. 17 is an enlarged top view illustrating a configuration of the attraction surface 271 of the lower chuck 231 according to the third modification example of the exemplary embodiment. As shown in FIG. 16 and FIG. 17, in the third modification example, the structure of the attraction surface 271 is different from that of the exemplary embodiment.

To elaborate, in the attraction surface 271 in the third modification example, there is no rib 275 provided around the entire edge the opening 273. Instead, a plurality of supporting pin 276 is provided along the edge of the opening 273.

With this configuration, the vicinity of the opening 273 in the lower wafer W2 is not supported by the rib 275 having the line shape but supported by the plurality of point-shaped supporting pins 276. Thus, it is possible to suppress the deformation of the lower wafer W2 due to a difference in the supported state, compared with other portions of the attraction surface 271.

Thus, according to the third modification example, it is possible to further reduce the distortion of the combined substrate T.

Additionally, in the third modification example, the leading end portion 265a of the lift pin 265 may be substantially on a level with the leading end portions of the supporting pins 276 when the upper wafer W1 and the lower wafer W2 are bonded. Thus, the lower wafer W2 can be supported by the leading end portion 265a of the lift pin 265 inside the opening 273 whose diameter is larger than the distance between the adjacent supporting pins 276.

Thus, according to the third modification example, since the deformation of the lower wafer W2 can be made smaller, the distortion of the combined substrate T can be further reduced.

In the example of FIG. 16, the flow path 281 is connected to the space 272 as well. However, the flow path 281 does not need to be connected to the space 272. Even with this configuration, the attraction pressure generator 280 is capable of controlling the space 272 into a negative pressure through the attraction surface 271.

Fourth Modification Example

Figure 18:
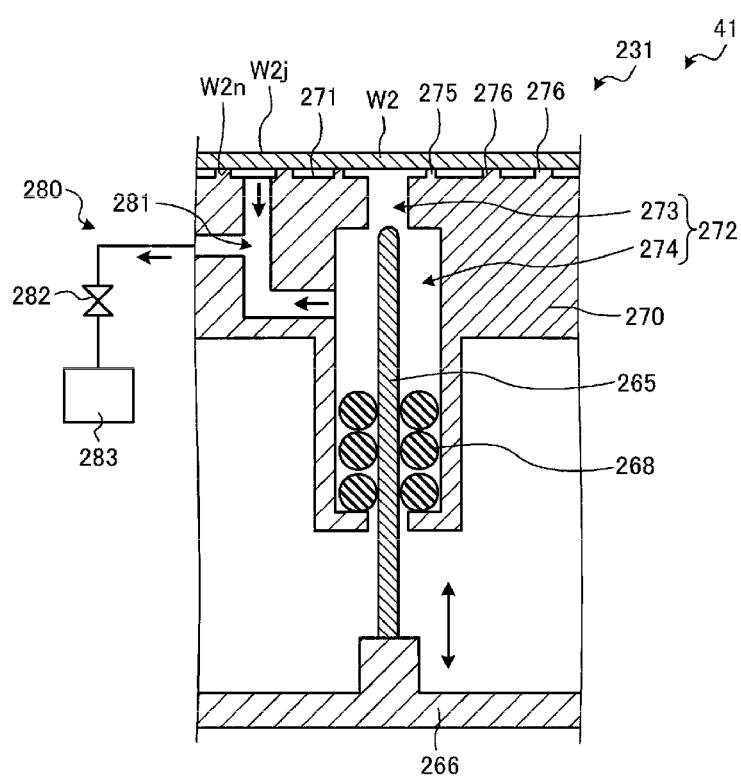
FIG. 18 is an enlarged cross sectional view illustrating a configuration of a lower chuck according to a fourth modification example of the exemplary embodiment.

FIG. 18 is an enlarged cross sectional view illustrating a configuration of the lower chuck 231 according to a fourth modification example of the exemplary embodiment. The above exemplary embodiment has been described for the example where the lip seal 267 is used as the sealing member configured to close the gap between the housing 270 and the lift pin 265. However, the sealing member of the present disclosure is not limited to the lip seal 267.

By way of non-limiting example, an O-ring seal 268 may be used as the sealing member configured to close the gap between the housing 270 and the lift pin 265, as illustrated in FIG. 18. With this configuration as well, the space 272 can be stably controlled to be under the negative pressure, so that the distortion of the combined substrate T can be stably reduced.

Fifth Modification Example

Figure 19:
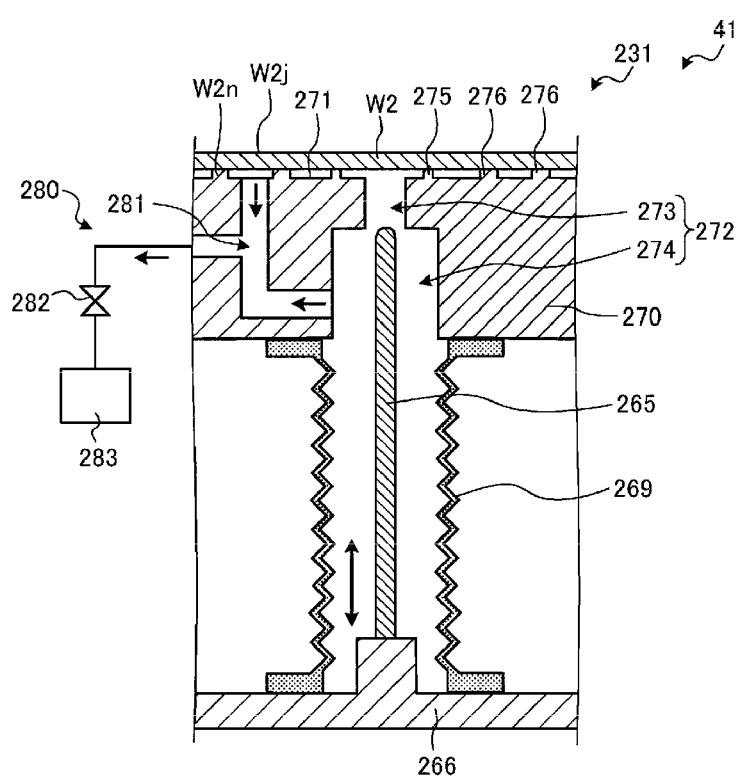
FIG. 19 is an enlarged cross sectional view illustrating a configuration of a lower chuck according to a fifth modification example of the exemplary embodiment.

FIG. 19 is an enlarged cross sectional view illustrating a configuration of the lower chuck 231 according to a fifth modification example of the exemplary embodiment. The above exemplary embodiment has been described for the example where the space 272 is stably controlled to the negative pressure by closing the gap between the housing 270 and the lift pin 265 with the sealing member. However, the present disclosure is not limited thereto.

By way of example, the lower chuck 231 may be provided with a bellows 269, as shown in FIG. 19. The bellows 269 is disposed between the housing 270 and the driving unit 266, and the inside of this bellows 269 is connected to the space 272. Further, the bellows 269 accommodates therein the lower portion of the lift pin 265.

With this configuration as well, when the lift pin 265 is moved up and down by the driving unit 266, the space 272 can be stably controlled to be under the negative pressure. Therefore, according to the fifth modification example, the distortion of the combined substrate T can be stably reduced.

Further, according to the fifth modification example, the amount of particles generated when the lift pins 265 are moved up and down can be reduced, so that the bonding quality of the combined substrate T can be improved.

The bonding apparatus 41 according to the exemplary embodiment is equipped with a first holder (the upper chuck 230), a second holder (the lower chuck 231), the attracting pressure generator 280, and the lift pins 265. The first holder (the upper chuck 230) is configured to hold a first substrate (the upper wafer W1). The second holder (the lower chuck 231) is disposed at a position facing the first holder (the upper chuck 230), and has the attraction surface 271 configured to attract a second substrate (the lower wafer W2) to be bonded to the first substrate (the upper wafer W1). The attracting pressure generator 280 is configured to generate an attracting pressure in the attraction surface 271. The lift pins 265 are configured to lift the second substrate (the lower wafer W2) on the attraction surface 271 apart from the second holder (the lower chuck 231). Further, the second holder (the lower chuck 231) is provided with the space 272 including the opening 273 through which the lift pin 265 passes, and the space 272 is controlled to have a pressure lower than atmospheric pressure. Accordingly, distortion of the combined substrate T can be reduced.

Moreover, in the bonding apparatus 41 according to the exemplary embodiment, the space 272 is suctioned by the attracting pressure generator 280. Thus, the manufacturing cost of the bonding apparatus 41 can be reduced.

Further, the bonding apparatus 41 according to the exemplary embodiment is further equipped with the suction unit 290 configured to suction the space 272 into the pressure lower than atmospheric pressure. Thus, distortion of the combined substrate T can be reduced stably.

Moreover, in the bonding apparatus 41 according to the exemplary embodiment, the suction unit 290 suctions the space 272 such that the internal pressure of the space 272 becomes higher than the attracting pressure. Therefore, distortion of the combined substrate T can be further reduced.

In addition, in the bonding apparatus 41 according to the exemplary embodiment, the second holder (the lower chuck 231) has the housing 270 and a sealing member (the lip seal 267 or the O-ring seal 268). The housing 270 forms the space 272. The sealing member (the lip seal 267 or the O-ring seal 268) is configured to close the gap between the housing 270 and the lift pins 265 when the first substrate (the upper wafer W1) and the second substrate (the lower wafer W2) are bonded. Accordingly, distortion of the combined substrate T can be reduced stably.

Moreover, in the bonding apparatus 41 according to the exemplary embodiment, the second holder (the lower chuck 231) has the housing 270, the driving unit 266, and the bellows 269. The housing 270 forms the space 272. The driving unit 266 is configured to drive the lift pins 265. The bellows 269 is disposed between the housing 270 and the driving unit 266, and the inside thereof is connected to the space 272. Accordingly, distortion of the combined substrate T can be reduced stably.

Further, in the bonding apparatus 41 according to the exemplary embodiment, the attraction surface 271 has multiple supporting pins 276 configured to support the second substrate (the lower wafer W2). In addition, when the first substrate (upper wafer W1) and the second substrate (lower wafer W2) are bonded to each other, the leading end portions 265a of the lift pins 265 are substantially on a level with the leading end portions of the multiple supporting pins 276. Accordingly, distortion of the combined substrate T can be further reduced.

Moreover, in the bonding apparatus 41 according to the exemplary embodiment, the attraction surface 271 has the multiple supporting pins 276 configured to support the second substrate (the lower wafer W2). Further, these supporting pins 276 are disposed along the edge of the opening 273. Accordingly, distortion of the combined substrate T can be further reduced.

Further, a bonding method according to the exemplary embodiment includes holding a first substrate (the upper wafer W1), holding a second substrate (the lower wafer W2), and bonding them. In the holding of the first substrate (the upper wafer W1), the first substrate (the upper wafer W1) is held by a first holder (the upper chuck 230). In the holding of the second substrate (the lower wafer W2), an attracting pressure is generated in the attraction surface 271 of the second holder (the lower chuck 231) provided at a position facing the first holder (the upper chuck 230) to hold the second substrate (the lower wafer W2). In the bonding, the first substrate (the upper wafer W1) and the second substrate (lower wafer W2) are bonded. Further, in the bonding, the space 272, provided in the second holder (the lower chuck 231) and provided with the opening 273 through which the lift pins 265 pass to space the second substrate (the lower wafer W2) on the attraction surface 271 apart from the second holder, is controlled to have a pressure lower than the atmospheric pressure. Accordingly, distortion of the combined substrate T can be reduced.

So far, the exemplary embodiment of the present disclosure has been described. However, the present disclosure is not limited to the above-described exemplary embodiment. Without departing from the spirit or scope of the subject matter presented herein, various changes and modifications may be made. For example, although the above exemplary embodiment has been described for the example where the space 272 through which the lift pins 265 of the lower chuck 231 are inserted is controlled to have the negative pressure, the present disclosure is not limited thereto.

By way of example, in the present disclosure, a space including an opening through which a lift pin provided in the upper chuck 230 is inserted may be controlled to have a negative pressure. With this configuration as well, deformation of the upper wafer W1 can be reduced, and, thus, distortion of the combined substrate T can be reduced.

Here, it should be noted that the above-described exemplary embodiments are illustrative in all aspects and are not anyway limiting. In fact, the above-described exemplary embodiments can be embodied in various forms. Further, the above-described exemplary embodiments may be omitted, replaced and modified in various ways without departing from the scope and the spirit of claims.

According to the exemplary embodiment, it is possible to reduce the distortion of the combined substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:
1. A bonding apparatus, comprising:
a first holder configured to hold a first substrate;
a second holder, disposed at a position facing the first holder, having an attraction surface configured to attract a second substrate to be bonded to the first substrate;

an attracting pressure generator configured to generate an attracting pressure in the attraction surface; and
a lift pin configured to space the second substrate on the attraction surface apart from the second holder,
wherein the second holder is provided with a space including an opening through which the lift pin passes, and
the space is controlled to have a pressure lower than an atmospheric pressure,
wherein the second holder comprises:
a housing forming the space;
a driving unit configured to drive the lift pin; and
a sealing member, disposed between the housing and the driving unit, configured to close a gap between the housing and the lift pin when the first substrate and the second substrate are bonded,
wherein the sealing member is an O-ring seal.

2. The bonding apparatus of claim 1, wherein the space is suctioned by the attracting pressure generator.

3. The bonding apparatus of claim 1, further comprising:
a suction unit configured to suction the space into the pressure lower than the atmospheric pressure.

4. The bonding apparatus of claim 3, wherein the suction unit suctions the space such that an internal pressure of the space becomes higher than the attracting pressure.

5. The bonding apparatus of claim 1, wherein the attraction surface has multiple supporting pins configured to support the second substrate, and
a leading end of the lift pin is substantially on a level with leading ends of the multiple supporting pins when the first substrate and the second substrate are bonded.

6. The bonding apparatus of claim 1, wherein the attraction surface has multiple supporting pins configured to support the second substrate, and
the supporting pins are disposed along an edge of the opening.

7. A bonding apparatus, comprising:
a first holder configured to hold a first substrate;
a second holder, disposed at a position facing the first holder, having an attraction surface configured to attract a second substrate to be bonded to the first substrate;
an attracting pressure generator configured to generate an attracting pressure in the attraction surface; and
a lift pin configured to space the second substrate on the attraction surface apart from the second holder,
wherein the second holder is provided with a space including an opening through which the lift pin passes, and
the space is controlled to have a pressure lower than an atmospheric pressure,
wherein the second holder comprises:
a housing forming the space;
a driving unit configured to drive the lift pin; and
a bellows, disposed between the housing and the driving unit, having an inside connected to the space.

8. A bonding method, comprising:
holding a first substrate with a first holder;
holding a second substrate by generating an attracting pressure in an attraction surface of a second holder disposed at a position facing the first holder; and
bonding the first substrate and the second substrate,
wherein in the bonding of the first substrate and the second substrate, a space, provided in the second holder and provided with an opening through which a lift pin configured to space the second substrate on the attraction surface apart from the second holder passes, is controlled to have a pressure lower than an atmospheric pressure, the second holder comprising: a housing forming the space; a driving unit configured to drive the lift pin; and a sealing member, disposed between the housing and the driving unit, configured to close a gap between the housing and the lift pin when the first substrate and the second substrate are bonded,
wherein the sealing member is an O-ring seal.

* * * * *